(12) United States Patent
Ji et al.

(10) Patent No.: US 12,021,088 B2
(45) Date of Patent: Jun. 25, 2024

(54) ARRAY SUBSTRATE, DISPLAY APPARATUS AND DRIVE METHOD THEREFOR

(71) Applicants: BEIJING BOE DISPLAY TECHNOLOGY CO., LTD., Beijing (CN); BOE TECHNOLOGY GROUP CO., LTD., Beijing (CN)

(72) Inventors: Haoliang Ji, Beijing (CN); Wenjun Xiao, Beijing (CN); Shijun Wang, Beijing (CN); Zhiying Bao, Beijing (CN); Wenkai Mu, Beijing (CN); Bingqing Yang, Beijing (CN); Xiaoxiao Chen, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 383 days.

(21) Appl. No.: 17/289,056

(22) PCT Filed: Aug. 6, 2020

(86) PCT No.: PCT/CN2020/107315
§ 371 (c)(1),
(2) Date: Apr. 27, 2021

(87) PCT Pub. No.: WO2021/031863
PCT Pub. Date: Feb. 25, 2021

(65) Prior Publication Data
US 2021/0408060 A1 Dec. 30, 2021

(30) Foreign Application Priority Data

Aug. 16, 2019 (CN) .......................... 201910760228.3

(51) Int. Cl.
*H01L 27/12* (2006.01)
*G09G 3/36* (2006.01)

(52) U.S. Cl.
CPC .......... *H01L 27/124* (2013.01); *G09G 3/3611* (2013.01); *G09G 3/3648* (2013.01)

(58) Field of Classification Search
CPC ... H01L 27/124; G09G 3/3611; G09G 3/3648
See application file for complete search history.

(56) References Cited

U.S. PATENT DOCUMENTS 9,508,304 B2  11/2016  Chen et al.
9,865,209 B2 *  1/2018  Oh ....................... G09G 3/3648
(Continued)

FOREIGN PATENT DOCUMENTS

CN       1746757 A     3/2006
CN     101566744 A    10/2009
(Continued)

*Primary Examiner* — Kenneth B Lee, Jr.
(74) *Attorney, Agent, or Firm* — Dilworth & Barrese, LLP.; Michael J. Musella, Esq.

(57) ABSTRACT

An array substrate, a display device and a driving method thereof are provided. The array substrate includes a plurality of sub-pixels arranged in an array in a first direction and a second direction; and a plurality of gate lines and a plurality of data lines. The plurality of data lines include first data lines and second data lines alternately arranged in the first direction, two columns of sub-pixels arranged in the second direction are arranged between a first data line and a second data line, and the first data line and the second data line are respectively configured to transmit data signals of different polarities. Two adjacent sub-pixels arranged in the first direction are respectively connected to the first data line and the second data line, and two adjacent sub-pixels arranged in the second direction are respectively connected to the first data line and the second data line.

15 Claims, 5 Drawing Sheets

(56) References Cited

U.S. PATENT DOCUMENTS

| | | | | |
|---|---|---|---|---|
| 2008/0079678 A1* | 4/2008 | Cho | .................... | G09G 3/3648 |
| | | | | 345/88 |
| 2018/0095334 A1* | 4/2018 | Zang | ................. | G02F 1/133707 |
| 2018/0114797 A1* | 4/2018 | Leng | ................. | G02F 1/136286 |
| 2018/0197495 A1* | 7/2018 | Xu | ....................... | G09G 3/3225 |
| 2019/0361304 A1* | 11/2019 | Gan | ................. | G02F 1/133514 |

FOREIGN PATENT DOCUMENTS

| | | |
|---|---|---|
| CN | 102890916 A | 1/2013 |
| CN | 104460151 A | 3/2015 |

\* cited by examiner ns an n r
ARRAY SUBSTRATE, DISPLAY APPARATUS AND DRIVE METHOD THEREFOR The present application claims priority of the Chinese Patent Application No. 201910760228.3 filed on Aug. 16, 2019, the entire disclosure of which, for all purposes, is incorporated herein by reference in its entirety as part of the present application.

TECHNICAL FIELD

At least one embodiment of the present disclosure relates to an array substrate, a display device and a driving method thereof.

BACKGROUND

Dual gate technology is a driving technology that reduces the number of data lines by half and doubles the number of gate lines in a display device. That is, the number of source driving integrated circuits connected with data lines is reduced by half, and the number of gate driving integrated circuits connected with gate lines is doubled. Because the unit price of the gate driving integrated circuit is cheaper than that of the source driving integrated circuit, the cost is reduced.

SUMMARY

At least one embodiment of the present disclosure provides an array substrate, a display device and a driving method thereof. The array substrate includes: a plurality of sub-pixels arrayed in a first direction and a second direction, the first direction being intersected with the second direction; a plurality of gate lines extending in the first direction; and a plurality of data lines extending in the second direction. The plurality of data lines include first data lines and second data lines alternately arranged in the first direction, two columns of sub-pixels extending in the second direction and arranged in the first direction are provided between a first data line and a second data line, the first data line and the second data line are configured to transmit data signals with different polarities, respectively, and different sub-pixels connected to a same data line are connected to different gate lines. Two adjacent sub-pixels arranged in the first direction are connected to the first data line and the second data line, respectively, and two adjacent sub-pixels arranged in the second direction are connected to the first data line and the second data line, respectively.

In some examples, the plurality of gate lines include first gate lines and second gate lines alternately arranged in the second direction, and a gate line pair formed of one first gate line and one second gate line is arranged between two adjacent sub-pixels arranged in the second direction.

In some examples, among sub-pixels arranged in the first direction, an odd number of sub-pixels are arranged between two sub-pixels connected to a same data line.

In some examples, among the sub-pixels arranged in the first direction, one sub-pixel is arranged between the two sub-pixels connected to the same data line.

In some examples, the two adjacent sub-pixels arranged in the first direction are respectively connected to the first data line and the second data line that are adjacent to each other.

In some examples, among sub-pixels arranged in the second direction, an odd number of sub-pixels are arranged between two sub-pixels connected to a same data line.

In some examples, among the sub-pixels arranged in the second direction, one sub-pixel is arranged between the two sub-pixels connected to the same data line.

In some examples, the two adjacent sub-pixels arranged in the second direction are respectively connected to the first data line and the second data line that are adjacent to each other.

In some examples, two gate lines respectively connected to the two adjacent sub-pixels arranged in the second direction are located between the two adjacent sub-pixels arranged in the second direction or located at both sides, along the second direction, of the two adjacent sub-pixels arranged in the second direction.

In some examples, among sub-pixels arranged in the first direction, two sub-pixels located at both sides of a same data line and closely adjacent to the same data line are connected to different data lines.

In some examples, the plurality of sub-pixels are divided into a plurality of sub-pixel groups arrayed in the first direction and the second direction, and each of the plurality of sub-pixel groups includes two sub-pixels arranged in the first direction; one column of sub-pixel groups extending in the second direction are arranged between the first data line and the second data line that are adjacent to each other, and the first data line and the second data line are respectively connected to the two sub-pixels in the sub-pixel group located between the first data line and the second data line. The plurality of sub-pixel groups include first sub-pixel groups and second sub-pixel groups, sub-pixels in the first sub-pixel groups are all connected to the data lines close to the sub-pixels, sub-pixels in the second sub-pixel groups are all connected to the data lines away from the sub-pixels, and the first sub-pixel groups and the second sub-pixel groups are alternately arranged in the first direction and in the second direction.

In some examples, one column of sub-pixels extending in the second direction have a same color, and two adjacent sub-pixels arranged in the first direction have different colors.

In some examples, adjacent sub-pixels of a same color arranged in the first direction are connected to the first data line and the second data line, respectively.

In some examples, a touch electrode line extending in the second direction is disposed between the two columns of sub-pixels that are arranged between the first data line and the second data line.

At least one embodiment of the present disclosure provides a display device, including the array substrate as mentioned above.

At least one embodiment of the present disclosure provides a driving method of the display device according to claim 15, including: inputting a gate signal to at least one gate line of the plurality of gate lines, so as to control a thin film transistor included in a sub-pixel connected to the at least one gate line to be turned on or turned off. The gate signal is configured to be in at least three stages, the at least three stages include a first stage, a second stage and a third stage, in the first stage, the gate signal is at a first level to input a turn-on voltage to the thin film transistor; in the second stage, the gate signal is at a second level to keep the thin film transistor in an on state, and the second level is lower than the first level; and in the third stage, the gate signal is at a third level to make the thin film transistor in an off state.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

In research, the inventors of the present application have observed that: a display device adopting the dual gate technology is prone to generate display defects such as a head shaking pattern (V-line) when applying a column inversion driving method. That is, when the user shakes his head, the user will observe that the display screen exhibits periodic bright and dark vertical stripes.

Figure 1A:
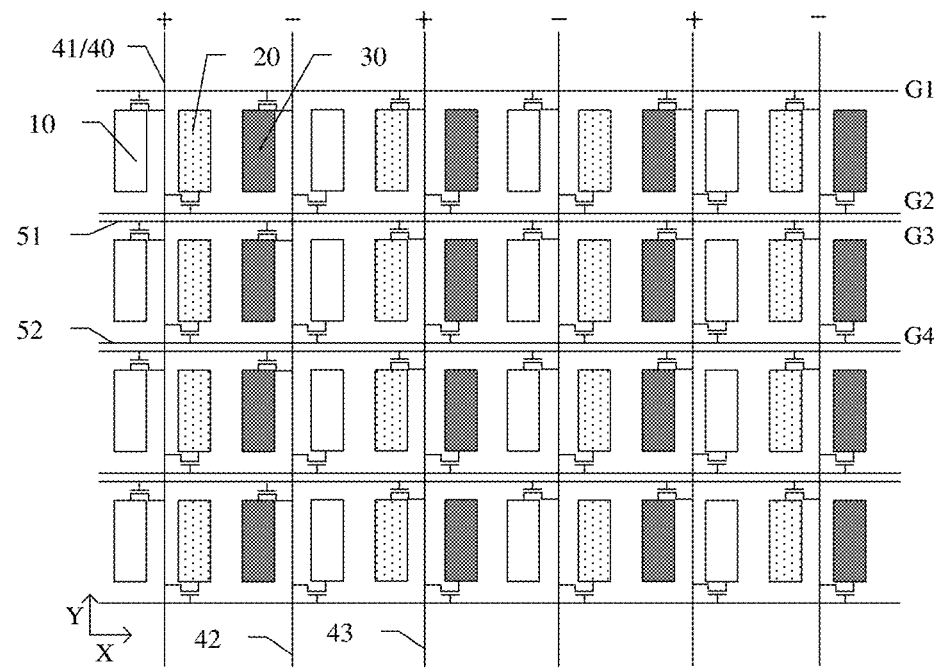
FIG. 1A is a partial structural view of a dual gate array substrate.

FIG. 1A is a partial structural view of a dual gate array substrate. As shown in FIG. 1A, the array substrate includes a plurality of sub-pixels arrayed in the X direction (row direction) and the Y direction (column direction), and the plurality of sub-pixels include red sub-pixels 10, green sub-pixels 20 and blue sub-pixels 30. The array substrate further includes data lines 40 extending in the Y direction, and first gate lines 51 and second gate lines 52 extending in the X direction. Two columns of sub-pixels are arranged between two adjacent data lines 40, and the first gate line 51 and the second gate line 52 are respectively located at both sides of each row of sub-pixels in the Y direction. The sub-pixels located at both sides of any data line 40 and closely adjacent to the data line 40 are connected to the data line 40, and for example, a red sub-pixel 10 and a green sub-pixel 20 (or a blue sub-pixel 30) adjacent thereto are connected to a data line 40 located therebetween. The above-mentioned "sub-pixel closely adjacent to the data line 40" means that there is not any other sub-pixel between the sub-pixel and the data line. Different sub-pixels connected to the same data line 40 are connected to different gate lines, For example, among the sub-pixels arranged in the X direction, one of the two sub-pixels connected to the same data line 40 is connected to the first gate line 51 and the other of the two sub-pixels connected to the same data line 40 is connected to the second gate line 52.

As shown in FIG. 1A, a display device including the array substrate shown in FIG. 1A can be driven in a column inversion manner. The column inversion method means to invert the polarity of display data every given number of sub-pixel columns. For the column inversion method, in one frame, the polarity of the data signal in each data line is always the same polarity (positive polarity or negative polarity). As shown in FIG. 1A, the polarities of voltages stored in two sub-pixel columns connected to the same data line 40 are the same, and the polarities of voltages stored in two sub-pixel columns connected to the two adjacent data lines 40 are opposite.

As shown in FIG. 1A, in one frame, the data signal in the first data line 41 is of positive polarity, the data signal in the second data line 42 is of negative polarity, and the data signal in the third data line 43 is of positive polarity, that is, in the X direction, the data signals in the plurality of data lines 40 alternate in polarity. Therefore, in one frame, two sub-pixel columns connected to the first data line 41 are charged with a positive polarity data signal, two sub-pixel columns connected to the second data line 42 are charged with a negative polarity data signal, two sub-pixel columns connected to the third data line 43 are charged with a positive polarity data signal, and so on. Therefore, in one frame, the polarities of data signals charged into the plurality of sub-pixel columns arranged in the X direction are in a cycle of positive polarity, positive polarity, negative polarity and negative polarity.

As shown in FIG. 1A, in one frame, the polarities of data signals charged into two sub-pixel columns between the first data line 41 and the second data line 42 are positive polarity and negative polarity, respectively. Therefore, in one frame, the brightness of two sub-pixel columns between two adjacent data lines can be averaged. However, in one frame, the polarities of the data signals charged into four sub-pixel columns between the first data line 41 and the third data line 43 are positive polarity, negative polarity, negative polarity and positive polarity, respectively, and the polarities of the data signals charged into two adjacent sub-pixel columns located in the middle are the same. In the case where the polarities of the data signals charged into two adjacent sub-pixel columns are the same, the brightness and darkness of the whole sub-pixels distributed on the array substrate may not be neutralized in the same frame, and it is necessary to change the polarity of the data signal in each data line in a next frame, so as to ensure the uniform brightness of the whole sub-pixels distributed on the array substrate.

Figure 1B:
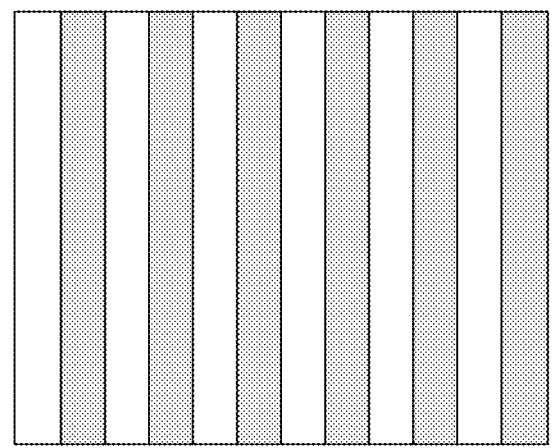
FIG. 1B shows periodic vertical stripes generated when the array substrate shown in FIG. 1A is used for display.

When the user's eyes are fixed and continuously observe the display device including the array substrate as shown in FIG. 1A, because the polarities of the data signals on the data lines in the next frame will be inversed, the brightness will be uniform after the brightness of each sub-pixel column in the adjacent frames is superimposed. However, when the user shakes his head, the observed picture may lose frames, resulting in that two adjacent sub-pixel columns, whose brightness cannot be averaged in the same frame, lose the possibility of neutralizing the brightness in the next frame, and further, resulting in the periodic vertical stripes shown in FIG. 1B.

Figures 1C, 1D:
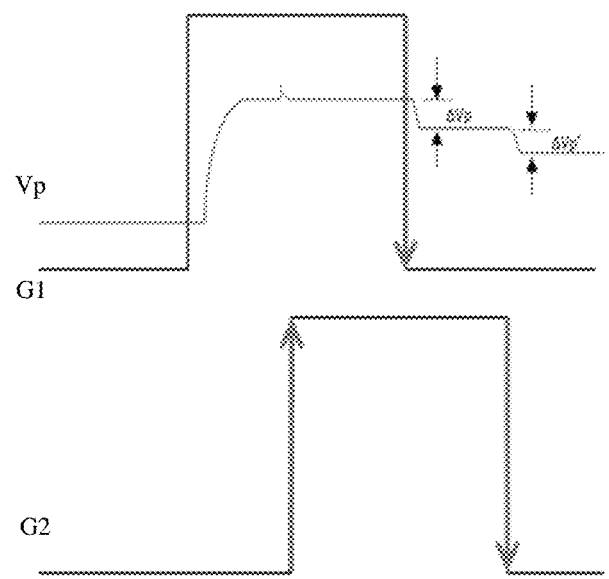
FIG. 1C is a pixel voltage waveform diagram of a first color sub-pixel when a gate signal is input to the pixel structure shown in FIG. 1A.
FIG. 1D is a luminance distribution diagram of some sub-pixels of the pixel structure shown in FIG. 1A.

FIG. 1C is a pixel voltage waveform diagram of a first color sub-pixel when a gate signal is input to the pixel structure shown in FIG. 1A, and FIG. 1D is a luminance distribution diagram of some sub-pixels of the pixel structure shown in FIG. 1A. As shown in FIGS. 1A-1D, a turn-on sequence of the gate lines in the array substrate is G1-G2-G4-G3 in turn, that is, the gate lines on the array substrate turn on the sub-pixels in an arcuate scanning column inversion manner. Because the array substrate is a dual gate array substrate, the gate line will generate coupling capacitance to adjacent and unconnected sub-pixels. In the case where the gate signal in the gate line jumps, the pixel voltage of the sub-pixel adjacent to and not connected to the gate line will also jump by capacitive coupling, resulting in a change of the brightness of the sub-pixel.

For example, as shown in FIG. 1C, in the case where a gate signal input to the gate line G1 is at an effective level (a level that can make the thin film transistor in an on state), the gate line G1 applies a turn-on voltage to the thin film transistor included in the first color sub-pixel 10 in the first row and first column, and the first color sub-pixel 10 is charged; in the case where a gate signal is input to the gate line G2, the coupling capacitance generated between the first color sub-pixel 10 and the gate line G2 causes the pixel voltage Vp of the first color sub-pixel 10 to jump, but in this case, the pixel voltage Vp of the first color sub-pixel 10 is still in a charging state, so the pixel voltage Vp of the first color sub-pixel 10 is pulled back to the charging voltage. When the gate signal in the gate line G1 changes from an effective level to an ineffective level (a level that can make the thin film transistor in an off state), the thin film transistor of the first color sub-pixel 10 is turned off, and the pixel voltage Vp of the first color sub-pixel 10 will drop by ΔVp due to the parasitic capacitance Cgs between the gate electrode and the source electrode of the thin film transistor in the first color sub-pixel 10. Then, when the gate signal in the gate line G2 changes from an effective level to an ineffective level, the pixel voltage Vp of the first color sub-pixel 10 drops again by ΔVp' due to the influence of the coupling capacitance between the first color sub-pixel 10 and the gate line G2. Therefore, when the input data signal of the sub-pixel affected by the coupling capacitance is positive, the brightness of the sub-pixel will be decreased (as shown in FIG. 1D, in the sub-pixel located in the first row and first column, the plus sign indicates that the input data signal is positive, and the down arrow indicates that the brightness is decreased); when the input data signal of the sub-pixel affected by the coupling capacitance is negative, the brightness of the sub-pixel will be increased (as shown in FIG. 1D, in the sub-pixel located in the first row and third column, the minus sign indicates that the input data signal is negative, and the up arrow indicates that the brightness is increased); however, no matter whether the input data signal is positive or negative, the brightness of the sub-pixel not affected by the coupling capacitance is unchanged (as shown in FIG. 1D, the brightness of the sub-pixel located in the first row and second column and the brightness of the sub-pixel located in the first row and fourth column are unchanged).

As shown in FIG. 1D, in the case where the gate lines on the array substrate turn on the sub-pixels in a column inversion manner, the whole sub-pixels will exhibit uneven brightness, resulting in frame loss and vertical stripes when the user shakes his head to watch the display device.

The embodiments of the present disclosure provide an array substrate, a display device and a driving method thereof. The array substrate includes a plurality of sub-pixels arrayed in a first direction and a second direction; a plurality of gate lines extending in the first direction; and a plurality of data lines extending in the second direction. The plurality of data lines include first data lines and second data lines alternately arranged in the first direction, two columns of sub-pixels extending in the second direction and arranged in the first direction are provided between a first data line and a second data line, the first data line and the second data line are configured to transmit data signals with different polarities, respectively, and different sub-pixels connected to a same data line are connected to different gate lines. Two adjacent sub-pixels arranged in the first direction are connected to the first data line and the second data line, respectively, and two adjacent sub-pixels arranged in the second direction are connected to the first data line and the second data line, respectively. In the display device adopting the array substrate provided by the embodiments of the present disclosure, the brightness distribution of the sub-pixels in one frame of display picture is uniform, so as to avoid the defect of V-line as much as possible.

Hereinafter, the array substrate, the display device and the driving method thereof provided by the embodiments of the present disclosure will be described with reference to the accompanying drawings.

Figures 2A, 2B:
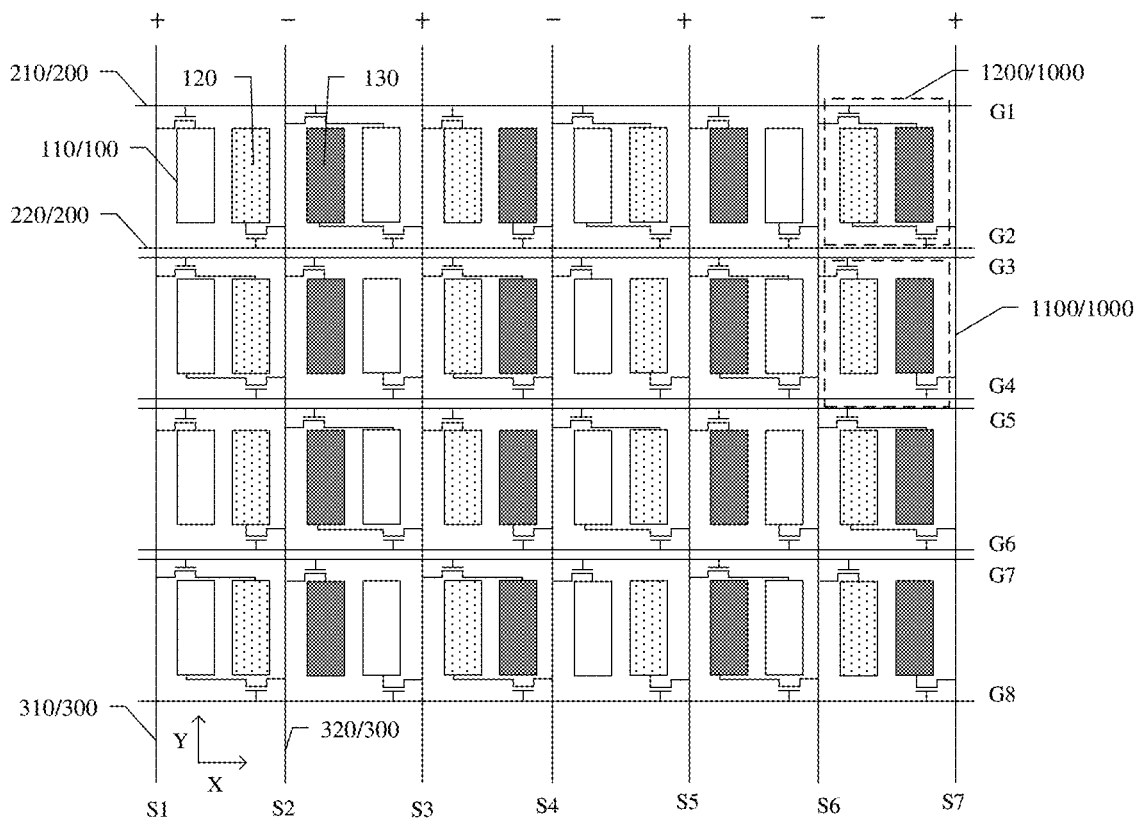
FIG. 2A is an array substrate provided by an embodiment of the present disclosure.
FIG. 2B is a luminance distribution diagram of sub-pixels in the array substrate shown in FIG. 2A.

FIG. 2A shows an array substrate provided by an embodiment of the present disclosure. As shown in FIG. 2A, the array substrate includes a plurality of sub-pixels 100 arrayed in a first direction and a second direction, a plurality of gate lines 200 extending in the first direction, and a plurality of data lines 300 extending in the second direction. For example, the embodiment of the present disclosure illustratively takes the direction parallel to the X direction as the first direction and the direction parallel to the Y direction as the second direction. The embodiments of the present disclosure are not limited thereto, and the first direction and the second direction can be interchanged. The first direction is intersected with the second direction, for example, the first direction is substantially perpendicular to the second direction.

As shown in FIG. 2A, the plurality of data lines 300 include first data lines 310 and second data lines 320 alternately arranged in the first direction, and two columns of sub-pixels 100 extending in the second direction and arranged in the first direction are provided between the first data line 310 and the second data line 320. The embodiment of the present disclosure takes that a plurality of sub-pixels arranged in the Y direction form a sub-pixel column as an example, and two sub-pixel columns are provided between the first data line 310 and the second data line 320. The first data line 310 and the second data line 320 are configured to transmit data signals with different polarities, respectively, and different sub-pixels 100 connected to the same data line 300 are connected to different gate lines 200. The above data signals with different polarities can mean that the data signal in the first data line and the data signal in the second data line have opposite polarities.

For example, the embodiment of the present disclosure illustratively shows that the first data line 310 is configured to transmit a data signal of positive polarity and the second data line 320 is configured to transmit a data signal of negative polarity. The embodiments of the present disclosure are not limited thereto, and the first data line can also be configured to transmit a data signal of negative polarity and the second data line can also be configured to transmit a data signal of positive polarity, as long as the two data lines are configured to transmit data signals with different polarities, respectively.

As shown in FIG. 2A, two adjacent sub-pixels 100 arranged in the first direction are connected to the first data line 310 and the second data line 320, respectively, and two adjacent sub-pixels 100 arranged in the second direction are connected to the first data line 310 and the second data line 320, respectively. In the case where the array substrate provided by the embodiments of the present disclosure is used for displaying a picture, two adjacent sub-pixels arranged in the first direction and two adjacent sub-pixels arranged the second direction are applied with data signals of opposite polarities in the same frame, so that the brightness distribution of the sub-pixels in the same frame of display picture can be uniform, thereby avoiding the occurrence of V-line as much as possible.

For example, as shown in FIG. 2A, the embodiment of the present disclosure illustratively shows seven data lines 300. Along a direction indicated by the arrow of the X direction, the seven data lines 300 are data line S1 to data line S7, respectively, and the data lines S1, S3, S5 and S7 are first data lines 310 (e.g., data signals of positive polarity are input thereto), and the data lines S2, S4 and S6 are second data lines 320 (e.g., data signals of negative polarity are input thereto).

For example, as shown in FIG. 2A, each sub-pixel 100 includes a thin film transistor, the gate electrode of the thin film transistor is connected to the gate line 200, one of the source electrode and the drain electrode of the thin film transistor is connected to the data line 300, and the other of the source electrode and the drain electrode of the thin film transistor is connected to the pixel electrode included in the sub-pixel 100.

In some examples, as shown in FIG. 2A, the plurality of gate lines 200 include first gate lines 210 and second gate lines 220 alternately arranged in the second direction, and a gate line pair formed of one first gate line 210 and one second gate line 220 is arranged between two adjacent sub-pixels 100 arranged in the second direction. In the embodiment of the present disclosure, sub-pixels 100 arranged in the X direction is taken as a sub-pixel row, and one first gate line 210 and one second gate line 220 are arranged between two adjacent sub-pixel rows. The array substrate provided by the embodiment of the disclosure is a dual gate array substrate, and the display device adopting the dual gate array substrate can reduce the cost.

For example, as shown in FIG. 2A, the embodiment of the present disclosure illustratively shows eight gate lines. Along a direction opposite to the pointing direction of the arrow of the Y direction, the eight gate lines are gate line G1 to gate line G8, respectively, and the gate lines G1, G3, G5 and G7 are first gate lines 210, and the gate lines G2, G4, G6 and G8 are second gate lines 220.

Figure 2C:
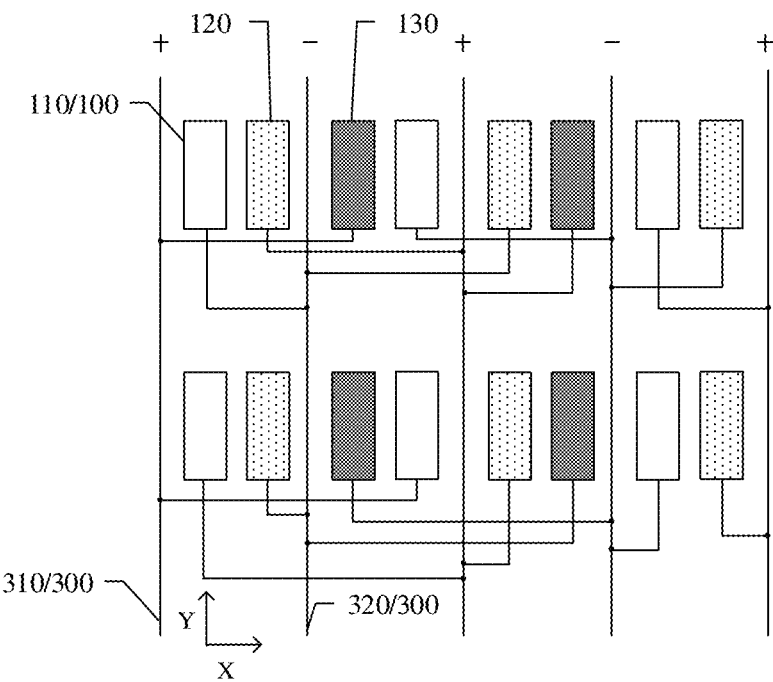
FIG. 2C shows an array substrate provided by an embodiment of the present disclosure.

In some examples, among the sub-pixels 100 arranged in the first direction, an odd number of sub-pixels 100 are arranged between two sub-pixels 100 connected to the same data line 300, so that two adjacent sub-pixels 100 arranged in the first direction can be connected to the first data line 310 and the second data line 320, respectively. For example, FIG. 2C shows an array substrate in an example of an embodiment of the present disclosure. For clarity, FIG. 2C only shows the connection relationship between the sub-pixels 100 and the data lines, and the connection relationship between the sub-pixels and the gate lines, for example, can refer to other embodiments. As shown in FIG. 2C, among the sub-pixels 100 arranged in the first direction, three sub-pixels 100 are provided between two sub-pixels 100 connected to the same data line 300.

For example, among the sub-pixels 100 arranged in the X direction, the number of sub-pixels 100 between two sub-pixels 100 connected to the same data line 300 can be one, three, etc. For example, in order to simplify the layout of connection lines between the data lines 300 and the sub-pixels 100, as shown in FIG. 2A, the number of sub-pixels 100 provided between two sub-pixels 100 connected to the same data line 300 can be set to one.

In some examples, as shown in FIG. 2A, two adjacent sub-pixels 100 arranged in the first direction are respectively connected to the first data line 310 and the second data line 320 that are adjacent to each other, thus facilitating the connection between the thin film transistors in the sub-pixels and the data lines.

In some examples, among the sub-pixels 100 arranged in the second direction, an odd number of sub-pixels 100 are arranged between two sub-pixels 100 connected to the same data line 300, so that two adjacent sub-pixels 100 arranged in the second direction can be connected to the first data line 310 and the second data line 320, respectively.

For example, among the sub-pixels 100 arranged in the Y direction, the number of sub-pixels 100 between two sub-pixels 100 connected to the same data line 300 can be one, three, etc. For example, in order to simplify the layout of connection lines between the data lines 300 and the sub-pixels 100, as shown in FIG. 2A, the number of sub-pixels 100 provided between two sub-pixels 100 connected to the same data line 300 can be set to one.

For example, as shown in FIG. 2A, among the sub-pixels 100 arranged in the first direction and the second direction, one sub-pixel 100 is provided between two sub-pixels 100 connected to the same data line 300.

In some examples, as shown in FIG. 2A, two adjacent sub-pixels 100 arranged in the second direction are respectively connected to the first data line 310 and the second data line 320 that are adjacent to each other, thus facilitating the connection between the thin film transistors in the sub-pixels and the data lines.

In some examples, as shown in FIG. 2A, two gate lines 200 respectively connected to two adjacent sub-pixels 100 arranged in the second direction can be located between the two adjacent sub-pixels 100, or can be located at both sides, along the second direction, of the two adjacent sub-pixels 100.

For example, as shown in FIG. 2A, in the first sub-pixel column, the second sub-pixel and the third sub-pixel are respectively connected to the first gate line 210 and the second gate line 220 in the same gate line group, that is, the thin film transistor of the second sub-pixel is located at one side of the second sub-pixel close to the third sub-pixel, and the thin film transistor of the third sub-pixel is located at one side of the third sub-pixel close to the second sub-pixel. In the first sub-pixel column, the third sub-pixel and the fourth sub-pixel are respectively connected to the gate lines in different gate line groups, and the thin film transistor of the fourth sub-pixel is located at one side of the fourth sub-pixel away from the third sub-pixel.

In some examples, as shown in FIG. 2A, among the sub-pixels 100 arranged in the first direction, two sub-pixels 100 located at both sides of one data line 300 and closely adjacent to the one data line 300 are connected to different data lines 300. The above-mentioned "two sub-pixels 100 located at both sides of one data line 300 and closely adjacent to the one data line 300" means that there is not any other sub-pixel between the two sub-pixels and the data line. In the embodiment of the present disclosure, two sub-pixels located at both sides of a data line and closely adjacent to the data line are connected to different data lines, so that the polarities of the data signals input to two adjacent sub-pixels arranged in the first direction are no longer the same, and therefore, the brightness of the whole display screen is uniform to avoid the occurrence of V-line as much as possible.

In some examples, as shown in FIG. 2A, the plurality of sub-pixels 100 can be divided into a plurality of sub-pixel groups 1000 arrayed in the first direction and the second direction, each sub-pixel group 1000 includes two sub-pixels 100 arranged in the first direction, multiple sub-pixel groups 1000 arranged in the second direction are provided between the first data line 310 and the second data line 320 that are adjacent to each other, and the two sub-pixels 100 in each sub-pixel group 1000 are respectively connected to the first data line 310 and the second data line 320 which are located at both sides of the each sub-pixel group 1000. That is, the first data line 310 and the second data line 320 that are adjacent to each other are respectively connected to two sub-pixels 100 in the sub-pixel group 1000 located therebetween. Moreover, the sub-pixel group 1000 includes a first sub-pixel group 1100 and a second sub-pixel group 1200, sub-pixels 100 in the first sub-pixel group 1100 are all connected to the data lines 300 close to the sub-pixels 100, sub-pixels 100 in the second sub-pixel group 1200 are all connected to the data lines 300 away from the sub-pixels 100, and the first sub-pixel groups 1100 and the second sub-pixel groups 1200 are alternately arranged in the first direction and in the second direction. That is, the sub-pixels 100 in the first sub-pixel group 1100 are connected to the data line 300 closely adjacent thereto, while one sub-pixel 100 is provided between the sub-pixel 100 in the second sub-pixel group 1200 and the data line 300 connected thereto.

For example, as shown in FIG. 2A, the plurality of sub-pixels 100 can include a first color sub-pixel 110, a second color sub-pixel 120, and a third color sub-pixel 130. A plurality of sub-pixels 100 arranged in the second direction have the same color, while two adjacent sub-pixels 100 arranged in the first direction have different colors. That is, the sub-pixels 100 in the same sub-pixel column have the same color, and a first color sub-pixel 110, a second color sub-pixel 120 and a third color sub-pixel 130 which are alternately arranged can be in the same sub-pixel row. That is, the sub-pixels 100 arranged in the X direction can be the first color sub-pixel 110, the second color sub-pixel 120 and the third color sub-pixel 130 in turn.

For example, the first color sub-pixel 110 can be a red sub-pixel, the second color sub-pixel 120 can be a green sub-pixel, and the third color sub-pixel 130 can be a blue sub-pixel. The embodiments of the present disclosure are not limited thereto, and colors of sub-pixels with different colors can be interchanged.

In some examples, as shown in FIG. 2A, adjacent sub-pixels 100 of the same color arranged in the first direction are connected to the first data line 310 and the second data line 320, respectively. The above-mentioned "adjacent sub-pixels 100 of the same color arranged in the first direction" means that there is no any other sub-pixel, between two adjacent sub-pixels 100 of the same color, of the same color as the two adjacent sub-pixels 100, but there may be sub-pixels of other colors between the two adjacent sub-pixels 100 of the same color.

For example, as shown in FIG. 2A, the first color sub-pixels 110 in the first row arranged in the X direction are sequentially connected with the data line S1, the data line S2, the data line S5 and the data line S6; the second color sub-pixels 120 in the first row arranged in the X direction are sequentially connected with the data line S2, the data line S3, the data line S4 and the data line S7; and the third color sub-pixels 130 in the first row arranged in the X direction are sequentially connected with the data line S3, the data line S4, the data line S5 and the data line S6, so as to ensure that adjacent sub-pixels of the same color arranged in the first direction are respectively input with driving data signals of different polarities, thus ensuring the brightness uniformity of the display picture.

Figure 2D:
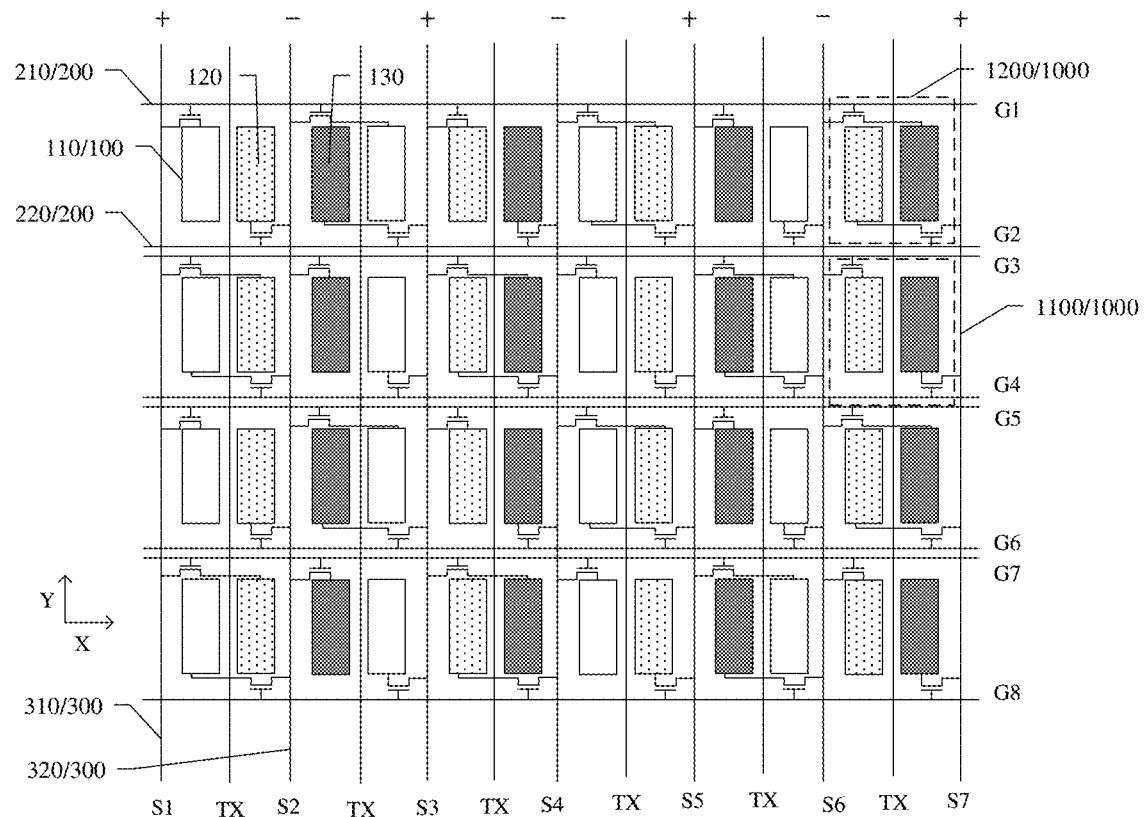
FIG. 2D shows an array substrate provided by another example of an embodiment of the present disclosure.

For example, FIG. 2D is a partial planar structural view of an array substrate provided by another example of the present disclosure. Different from the example shown in FIG. 2A, in the present example, a touch electrode line TX used for touch control can further be provided between two sub-pixel columns that are located between adjacent first data line 310 and second data line 320, and the touch electrode line TX is parallel to the data line 300.

For example, FIG. 2B is a luminance distribution diagram of sub-pixels in the array substrate shown in FIG. 2A. As shown in FIG. 2A, among the first row of sub-pixels 100 arranged in the X direction, the first sub-pixel 110 is connected to the gate line G1 and the data line S1, the second sub-pixel 120 is connected to the gate line G2 and the data line S2, the third sub-pixel 130 is connected to the gate line G2 and the data line S3, the fourth sub-pixel 110 is connected to the gate line G1 and the data line S2, the fifth sub-pixel 120 is connected to the gate line G1 and the data line S3, the sixth sub-pixel 130 is connected to the gate line G2 and the data line S4, the seventh sub-pixel 110 is connected to the gate line G2 and the data line S5, the eighth sub-pixel 120 is connected to the gate line G1 and the data line S4, the ninth sub-pixel 130 is connected to the gate line G1 and the data line S5, the tenth sub-pixel 110 is connected to the gate line G2 and the data line S6, the eleventh sub-pixel 120 is connected to the gate line G2 and the data line S7, and the twelfth sub-pixel 130 is connected to the gate line G1 and the data line S6. Data lines S1, S3, S5 and S7 are configured to transmit data signals of positive polarity, and data lines S2, S4 and S6 are configured to transmit data signals of negative polarity.

For example, the embodiment of the present disclosure is described by taking that the turn-on sequence of the gate lines on the array substrate is G1-G2-G4-G3-G5-G6-G8-G7 in turn. The embodiments of the present disclosure are not limited thereto, and the turn-on sequence of the gate lines can also adopt other sequences.

For example, as shown in FIG. 2A and FIG. 2B, taking the sub-pixels located in the first row, the gate line G1 and the gate line G2 as an example, when a gate signal input to the gate line G1 is at an effective level, the gate line G1 applies a turn-on voltage to the thin film transistors of the first sub-pixel, the fourth sub-pixel, the fifth sub-pixel, the eighth sub-pixel, the ninth sub-pixel and the twelfth sub-pixel connected with the gate line G1, and these six sub-pixels are charged, and the effective level refers to a voltage which can make the thin film transistor in an on state; then, after a gate signal is input to the gate line G2, the pixel voltages in the six sub-pixels are affected by the coupling capacitance with the gate line G2, resulting in voltage jump. The first sub-pixel, the fifth sub-pixel and the ninth sub-pixel are connected to a data line transmitting the data signal of positive polarity, and therefore, after the gate signal in the gate line G2 is at an ineffective level, the brightness of the first sub-pixel, the fifth sub-pixel and the ninth sub-pixel will be decreased (as shown in FIG. 2B, the plus sign indicates that the polarity of the input data signal is positive, and the down arrow indicates that the brightness of the sub-pixel is decreased); the fourth sub-pixel, the eighth sub-pixel and the twelfth sub-pixel are connected to a data line transmitting the data signal of negative polarity, and therefore, after the gate signal in the gate line G2 is at an ineffective level, the brightness of the fourth sub-pixel, the eighth sub-pixel and the twelfth sub-pixel will be increased (as shown in FIG. 2B, the minus sign indicates that the polarity of the input data signal is negative, and the up arrow indicates that the brightness of the sub-pixel is increased); the pixel voltages of the second sub-pixel, the third sub-pixel, the sixth sub-pixel, the seventh sub-pixel, the tenth sub-pixel and the eleventh sub-pixel that are connected to the gate line G2 and located in the first row are not affected by the coupling capacitance, the brightness thereof is unchanged (as shown in FIG. 2B, the brightness of the sub-pixel without the up arrow or the down arrow is unchanged). Therefore, the brightness distribution of the first row of sub-pixels arranged in the X direction is darkest, middle bright, middle bright, brightest, darkest, middle bright, middle bright, brightest, darkest, middle bright, middle bright, and brightest. In the same way, the brightness variation rule of other sub-pixels as shown in FIG. 2B is the same as above. Therefore, the brightness of two adjacent sub-pixel columns in the embodiment of the present disclosure can be neutralized by adjusting the connection relationship between thin film transistors in sub-pixels and data lines, so as to make the brightness of the display device including the above pixel structure uniform in one frame of display picture, thus avoiding the occurrence of V-line.

For example, the array substrate can be an array substrate used for a liquid crystal display device. Each sub-pixel can include a pixel electrode, and the pixel electrode is connected to a corresponding data line.

For example, the data lines can be divided into odd-column data lines and even-column data lines according to the arrangement sequence along the first direction. The odd-column data lines and the even-column data lines are alternately arranged. For example, the odd-column data lines can be configured to apply data signals of positive polarity, and the even-column data lines can be configured to apply data signals of negative polarity; alternatively, the odd-column data lines can be configured to apply data signals of negative polarity, and the even-column data lines can be configured to apply data signals of positive polarity.

For example, the application of the data signals of positive polarity and the data signals of negative polarity can be controlled by a data driver connected to the data lines. For example, the data driver is configured to apply data signals of positive polarity to the odd-column data lines and to apply data signals of negative polarity to the even-column data lines; alternatively, the data driver is configured to apply data signals of negative polarity to the odd-column data lines and to apply data signals of positive polarity to the even-column data lines.

Another embodiment of the present disclosure provides a display device which includes the array substrate described above. In the display device provided by the embodiment of the present disclosure, the brightness distribution of sub-pixels is uniform in one frame of display picture, so as to avoid the occurrence of V-line as much as possible.

For example, the display device can be a liquid crystal display device, and any product or component which includes the liquid crystal display device and has display function, such as a television, a digital camera, a mobile phones, a watch, a tablet computer, a notebook computer, a navigator, etc., without being limited in the present embodiment.

Another embodiment of the present disclosure provides a driving method of the display device described above, and the driving method includes: inputting a gate signal to at least one gate line of the plurality of gate lines, so as to control a thin film transistor included in a sub-pixel connected to the at least one gate line to be turned on or off. The gate signal is configured to be in at least three stages, and the at least three stages includes a first stage, a second stage and a third stage. In the first stage, the gate signal is at a first level to input a turn-on voltage to the thin film transistor; in the second stage, the gate signal is at a second level to keep the thin film transistor in an on state, and the second level is lower than the first level; and in the third stage, the gate signal is at a third level to make the thin film transistor in an off state.

Figure 3:
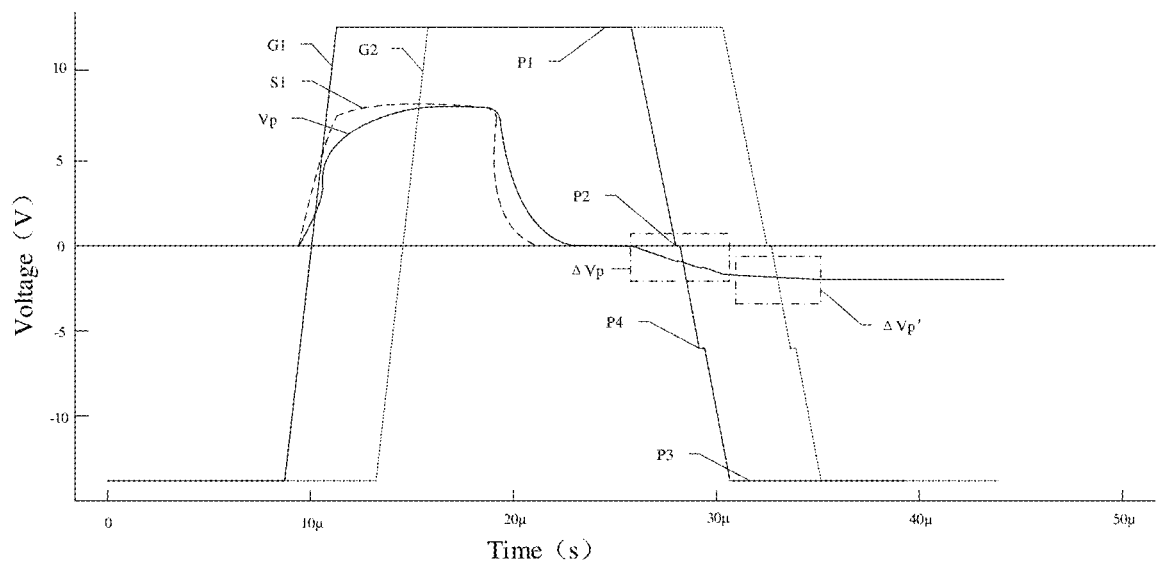
FIG. 3 is a timing chart when driving the display device including the array substrate shown in FIG. 2A.

FIG. 3 is a timing chart when driving the display device including the array substrate shown in FIG. 2A. As shown in FIG. 2A and FIG. 3, a gate signal is input to the gate line G1 to control the thin film transistor of the first sub-pixel 100 in the first row and connected to the gate line G1 to be turned on, and the data line S1 charges the first sub-pixel 100 through the thin film transistor that has been turned on, so that the pixel voltage Vp of the first sub-pixel 100 gradually increases to a charging voltage value.

For example, the gate signal input to the gate line G1 is configured to be in at least three stages, and FIG. 3 illustratively shows that the thin film transistor is of N-type, which is not limited thereto. FIG. 3 illustratively shows that the gate signal is in four stages, which is not limited thereto, as long as the gate signal is in no less than three stages. As shown in FIG. 3, in the first stage P1, the gate signal is at a first level (effective level) to input a turn-on voltage to the thin film transistor of the first sub-pixel 100, and the data line S1 inputs a data signal to the first sub-pixel 100 located in the first row. Then, the gate signal gradually decreases to the second stage P2, and the gate signal in the second stage P2 is at a second level (effective level) to keep the thin film transistor still in an on state, and the second level is lower than the first level. FIG. 3 illustratively shows that the second level is 0V, which is not limited thereto, and the second level can also be at a level of 4V or greater than 0V to keep the thin film transistor still in an on state. In the process that the gate signal drops from the first level to the second level, the pixel voltage Vp also drops, and when the gate signal of the gate line G1 is at the second level, the pixel voltage Vp is also in a gentle stage. In the process of the gate signal of the gate line G1 from the second stage P2 to the third stage P3, the gate signal of the gate line G1 is decreased from the second level to the third level (ineffective level), so that the thin film transistor of the first sub-pixel 100 is in an off state. In the process that the gate signal drops from the second level to the third level, the pixel voltage Vp also drops, and when the gate signal of the gate line G1 is at the third level in the third stage, the pixel voltage Vp is also in a gentle stage. Therefore, in the process that the gate signal of the gate line G1 drops from the first level to the third level in stages, the pixel voltage Vp drops by ΔVp. Compared with the process that the first level directly drops to the third level, in the embodiment of the present disclosure, by reducing the gate signal in stages to the third level that turns the thin film transistor off, the dropped voltage ΔVp of the pixel voltage Vp can be reduced.

As shown in FIG. 3, in an example of the embodiment of the present disclosure, before the gate signal in the gate line G1 drops to the third level, a fourth stage P4 is further included. In this stage, the gate signal is at a fourth level, and the fourth level can be an effective level or an ineffective level, without being limited in the embodiment of the present disclosure. In the case where the fourth level is an effective level, the thin film transistor of the first sub-pixel 100 is still in an on state, and the fourth level is less than the second level. In the process that the gate signal drops from the second level to the fourth level, the pixel voltage Vp also drops, and when the gate signal of the gate line G1 is at the fourth level in the fourth stage, the pixel voltage Vp is also in a gentle stage. In the process of the gate signal of the gate line G1 from the fourth stage P4 to the third stage P3, the gate signal of the gate line G1 is decreased from the fourth level to the third level, so that the thin film transistor of the first sub-pixel 100 is in an off state. Therefore, in the process that the gate signal of the gate line G1 drops from the first level to the second level, to the fourth level and to the third level in turn, the pixel voltage Vp drops by ΔVp. Compared with the process that the first level directly drops to the third level, in the embodiment of the present disclosure, by dropping the gate signal to the third level in stages, the voltage ΔVp by which the pixel voltage VP drops is less.

For example, the gate signal input to the gate line G2 is also configured to be in the same four stages as the gate signal input to the gate line G1. Because the gate signal input to the gate line G2 does not drop directly from the first level to the third level, but drops to the third level in stages, this process can reduce the influence of the coupling capacitance generated between the gate line G2 and the first sub-pixel 100 on the pixel voltage Vp of the first sub-pixel 100, so that the voltage ΔVp' by which the pixel voltage Vp drops again is as small as possible.

Therefore, the embodiment of the present disclosure can further reduce the influence of the coupling capacitance on the pixel voltage by dropping the gate signal input to the gate line to an ineffective level in stages, thereby further alleviating the defect of V-line.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A driving method of the display device, the display device, comprising an array substrate, comprising:
 a plurality of sub-pixels arrayed in a first direction and a second direction, the first direction being intersected with the second direction;
 a plurality of gate lines extending in the first direction; and
 a plurality of data lines extending in the second direction, wherein the plurality of data lines comprise first data lines and second data lines alternately arranged in the first direction, two columns of sub-pixels extending in the second direction and arranged in the first direction are provided between a first data line and a second data line that are adjacent to each other, the first data line and the second data line are configured to transmit data signals with different polarities, respectively, and different sub-pixels connected to a same data line are connected to different gate lines;
 wherein any two adjacent sub-pixels arranged in the first direction are connected to the first data line and the second data line, respectively, and any two adjacent sub-pixels arranged in the second direction are connected to the first data line and the second data line, respectively,
 the driving method comprising:
 inputting a gate signal to at least one gate line of the plurality of gate lines, so as to control a thin film transistor included in a sub-pixel connected to the at least one gate line to be turned on or turned off,
 wherein the gate signal is configured to be in at least three stages, the at least three stages comprise a first stage, a second stage and a third stage,
 in the first stage, the gate signal is at a first level to input a turn-on voltage to the thin film transistor;
 in the second stage, the gate signal is at a second level to keep the thin film transistor in an on state, and the second level is lower than the first level; and
 in the third stage, the gate signal is at a third level to make the thin film transistor in an off state, and the third level is lower than the second level.

2. The driving method according to claim 1, wherein the plurality of gate lines comprise first gate lines and second gate lines alternately arranged in the second direction, and a gate line pair formed of one first gate line and one second gate line is arranged between two adjacent sub-pixels arranged in the second direction.

3. The driving method according to claim 1, wherein among sub-pixels arranged in the first direction, an odd number of sub-pixels are arranged between two sub-pixels connected to a same data line.

4. The driving method according to claim 3, wherein among the sub-pixels arranged in the first direction, one sub-pixel is arranged between the two sub-pixels connected to the same data line.

5. The driving method according to claim 3, wherein the two adjacent sub-pixels arranged in the first direction are respectively connected to the first data line and the second data line that are adjacent to each other.

6. The driving method according to claim 1, wherein among sub-pixels arranged in the second direction, an odd number of sub-pixels are arranged between two sub-pixels connected to a same data line.

7. The driving method according to claim 6, wherein among the sub-pixels arranged in the second direction, one sub-pixel is arranged between the two sub-pixels connected to the same data line.

8. The driving method according to claim 6, wherein the two adjacent sub-pixels arranged in the second direction are respectively connected to the first data line and the second data line that are adjacent to each other.

9. The driving method according to claim 8, wherein two gate lines respectively connected to the two adjacent sub-pixels arranged in the second direction are located between the two adjacent sub-pixels arranged in the second direction or located at both sides, along the second direction, of the two adjacent sub-pixels arranged in the second direction.

10. The driving method according to claim 1, wherein among sub-pixels arranged in the first direction, two sub-pixels located at both sides of a same data line and closely adjacent to the same data line are connected to different data lines.

11. The driving method according to claim 1, wherein the plurality of sub-pixels are divided into a plurality of sub-pixel groups arrayed in the first direction and the second direction, and each of the plurality of sub-pixel groups comprises two sub-pixels arranged in the first direction;

one column of sub-pixel groups extending in the second direction are arranged between the first data line and the second data line that are adjacent to each other, and the first data line and the second data line are respectively connected to the two sub-pixels in the sub-pixel group located between the first data line and the second data line, wherein the plurality of sub-pixel groups comprise first sub-pixel groups and second sub-pixel groups, sub-pixels in the first sub-pixel groups are all connected to the data lines close to the sub-pixels, sub-pixels in the second sub-pixel groups are all connected to the data lines away from the sub-pixels, and the first sub-pixel groups and the second sub-pixel groups are alternately arranged in the first direction and in the second direction.

12. The driving method according to claim 1, wherein one column of sub-pixels extending in the second direction have a same color, and two adjacent sub-pixels arranged in the first direction have different colors.

13. The driving method according to claim 12, wherein adjacent sub-pixels of a same color arranged in the first direction are connected to the first data line and the second data line, respectively.

14. The driving method according to claim 1, wherein a touch electrode line extending in the second direction is disposed between the two columns of sub-pixels that are arranged between the first data line and the second data line adjacent to each other.

15. A driving method of the display device, the display device, comprising an array substrate, comprising:

a plurality of sub-pixels arrayed in a first direction and a second direction, the first direction being intersected with the second direction;

a plurality of gate lines extending in the first direction; and a plurality of data lines extending in the second direction, wherein the plurality of data lines comprise first data lines and second data lines alternately arranged in the first direction, two columns of sub-pixels extending in the second direction and arranged in the first direction are provided between a first data line and a second data line that are adjacent to each other, the first data line and the second data line are configured to transmit data signals with different polarities, respectively, and different sub-pixels connected to a same data line are connected to different gate lines;

wherein two adjacent sub-pixels arranged in the first direction are connected to the first data line and the second data line, respectively, and two adjacent sub-pixels arranged in the second direction are connected to the first data line and the second data line, respectively, the driving method comprising:

inputting a gate signal to at least one gate line of the plurality of gate lines, so as to control a thin film transistor included in a sub-pixel connected to the at least one gate line to be turned on or turned off, wherein the gate signal is configured to be in at least three stages, the at least three stages comprise a first stage, a second stage and a third stage, in the first stage, the gate signal is at a first level to input a turn-on voltage to the thin film transistor;

in the second stage, the gate signal is at a second level to keep the thin film transistor in an on state, and the second level is lower than the first level; and in the third stage, the gate signal is at a third level to make the thin film transistor in an off state;

the plurality of sub-pixels are divided into a plurality of sub-pixel groups arrayed in the first direction and the second direction, and each of the plurality of sub-pixel groups comprises two sub-pixels arranged in the first direction;

one column of sub-pixel groups extending in the second direction are arranged between the first data line and the second data line that are adjacent to each other, and the first data line and the second data line are respectively connected to the two sub-pixels in the sub-pixel group located between the first data line and the second data line, wherein the plurality of sub-pixel groups comprise first sub-pixel groups and second sub-pixel groups, sub-pixels in the first sub-pixel groups are all connected to the data lines close to the sub-pixels, sub-pixels in the second sub-pixel groups are all connected to the data lines away from the sub-pixels, and the first sub-pixel groups and the second sub-pixel groups are alternately arranged in the first direction and in the second direction.

* * * * *